(12) United States Patent
Lyubman (10) Patent No.: US 8,612,670 B2
(45) Date of Patent: Dec. 17, 2013

(54) METHOD AND SYSTEM FOR MANAGING FLASH WRITE

(75) Inventor: Yakov Lyubman, Qiryat-Ono (IL)

(73) Assignee: DSP Group Ltd., Herzeliya (IL)

( * ) Notice: Subject to any disclaimer, the term of this patent is extended or adjusted under 35 U.S.C. 154(b) by 180 days.

(21) Appl. No.: 13/290,089

(22) Filed: Nov. 6, 2011

(65) Prior Publication Data

US 2013/0117496 A1 May 9, 2013

(51) Int. Cl.
*G06F 13/10* (2006.01)

(52) U.S. Cl.
USPC .......................................................... 711/103

(58) Field of Classification Search
None
See application file for complete search history.

(56) References Cited

U.S. PATENT DOCUMENTS

| | | | |
|---|---|---|---|
| 6,977,847 B2 | 12/2005 | Lasser et al. | |
| 6,988,175 B2 | 1/2006 | Lasser | |
| 2005/0170893 A1* | 8/2005 | Muir et al. | 463/42 |
| 2008/0062786 A1* | 3/2008 | Kim et al. | 365/201 |
| 2009/0086880 A1* | 4/2009 | Shen et al. | 377/26 |

* cited by examiner

*Primary Examiner* — Duc Doan
(74) *Attorney, Agent, or Firm* — Oren Reches (57) ABSTRACT

A method for managing flash memory operations in a flash memory, comprising; assigning a state code to said flash memory operations; updating a state code flag with the assigned state code upon completion of each of said flash memory operations; wherein the assignment of said state codes is selected in a way that each of said updating a state code flag is performed by changing of one bit of the state code flag from one to zero.

6 Claims, 6 Drawing Sheets

METHOD AND SYSTEM FOR MANAGING FLASH WRITE

TECHNICAL FIELD

The present disclosure relates generally to the field of writing a flash memory and more particularly to a method and system for enabling a reliable recover from unexpected power down during flash operation.

BACKGROUND

While Flash memory is a non-volatile memory, it is prone to data corruption due to power loss that may occur at any unexpected moment and during any operation type that is being carried out by the flash. The problem arises from the fact that power loss may occur at the middle of an operation, such as write data or erase data, when power is restored, it is not possible to know if the last operation before power loss was properly completed or not.

The problem of interrupted flash operation becomes more significant because some flash operations are relatively very long operations, for example, a write operation may last between one to five milliseconds and erase can achieve few hundreds milliseconds.

It should be noted that write operations to flash memory, unlike other memories such as hard-disk or RAM, can only be written as "0". When it is desired to write "1", the block should be erased. The erase operation sets all the bits of an erased block to "1" and afterwards all the bits that were previously set to "0" should be re-written.

Some existing flash systems solved the problem by usage of a Uninterruptible Power Supply (UPS) that enables to retain power for at least some milliseconds—the duration that is required to complete a flash write operation and even erase operation, (Typically—the longest operation). However this solution requires a significant hardware addition to the system.

Another solution that refers specifically to a flash-erase operation is disclosed in U.S. Pat. No. 6,977,847 by Lasser et al. However, Lasser solves only the case of power loss during erase while a power loss may corrupt data in any flash operation phase, such as flash data-write. Furthermore Lasser does not solve the case wherein the operation of setting a flag for indicating the status of an operation fails due to power loss.

There is a need for a method and system for enabling to keep safe data managing that guarantees data integrity after power loss that may interrupt any data operation.

SUMMARY

There is provided a method and apparatus that enables to track flash memory operations in general, and specifically critical flash memory operations and enabling safe recovery in case of power loss, when it cannot be guaranteed if a flash memory operation was successfully completed. The method and apparatus assign a state code to each critical memory operation and a state code flag is updated upon completion of each of the flash memory operations. The state codes are stored in the flash and selected in a way that updating a state code flag always changes a single bit of the state code flag from "1" to "0". When power is restored after power loss, the state code flag is read and a control program is able to determine the last critical flash memory that was successfully completed. Accordingly data can be restored according to the last critical flash memory that was successfully completed.

An aspect of the disclosed subject matter relates to a method and a system for managing flash memory operations in a flash memory, the method comprising; assigning a state code to said flash memory operations; updating a state code flag with the assigned state code upon completion of each of said flash memory operations; wherein the assignment of said state codes is selected in a way that each of said updating a state code flag is performed by changing of one bit of the state code flag from one to zero.

There is provided a method and apparatus, wherein the flash memory operations are critical flash memory operations.

There is provided a method and apparatus wherein said flash memory operations include a memory-write operation.

There is provided a method and apparatus wherein the state code flag is located in said flash memory.

There is provided a method and apparatus wherein the method further comprises reading the state code flag upon power up and determining the last critical flash memory operation that was successfully completed.

There is provided a method and apparatus wherein data records resulted by a critical flash memory operation that was successfully completed are saved until it can be determined if a sequential critical flash memory operation was successfully completed.

There is provided a method and apparatus wherein the saved data records resulted by critical flash memory operation that was successfully completed are used for recovering from a sequential critical flash memory operation that was not successfully completed.

BRIEF DESCRIPTION OF THE DRAWINGS

The present disclosure will be understood and appreciated more fully from the following detailed description taken in conjunction with the drawings. Identical structures, elements or parts, which appear in more than one figure, are generally labeled with a same or similar number in all the figures in which they appear, wherein.

DETAILED DESCRIPTION

Figure 1:
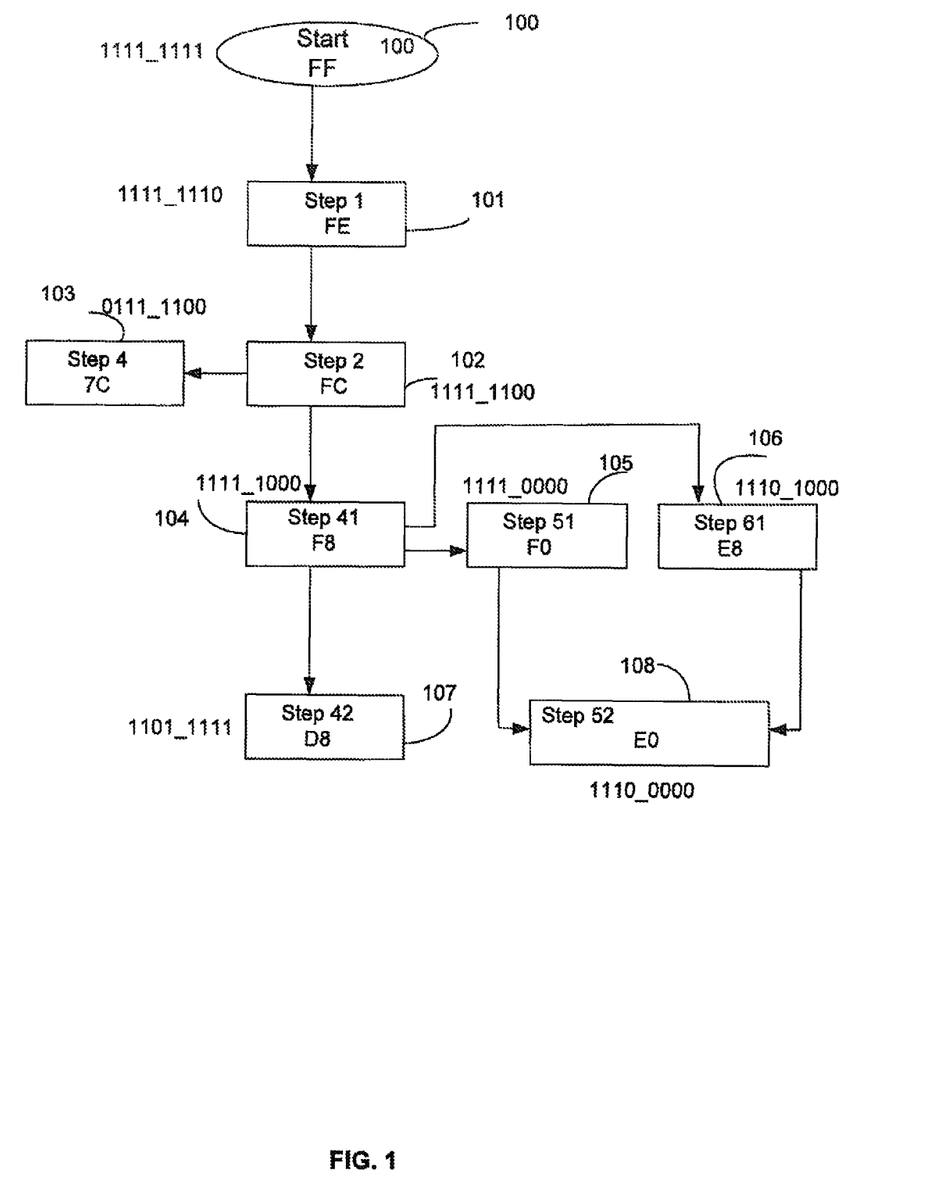
FIG. 1 is a general flow chart that describes a general flow managed in accordance with the disclosed subject matter.

FIG. 1 shows a flow chart of a general flow that is managed in accordance with the disclosed subject matter.

The flow chart describes nine states: 100-108 respectively. The steps may be any states for example managing a voice packet that is stored in a flash memory. The steps may correspond for example to: 101—write field one; 102 write field two; 103 erase block n; 104—write field three; 105 write field four; 106 write field five; 107—erase block n+1; 108—erase block n+2

Each step 100-108 is associated with a one byte code (hereinafter "state code"). However the state codes are selected and assigned to the flow states in a way that fulfils two conditions (hereinafter "state code conditions"): (a) each step (current state) is associated with a state code that differs from its preceding state code (the state code that is assigned to the state from which it is possible to arrive to the current state) by only one bit (hereinafter "changing bit"). (b) The changing bit always changes from "1" in the preceding state code to "0" in the state code of the current state. For example step 61 (the current state) marked as 106 has a state code 0xE8 (1110_1000), its preceding state is step 41 that has a state code 0xF8 (1111_1000), the changing bit is bit[4] (the bits are marked from b[0] lsb to b[7] msb). As can be seen in FIG. 1, this rule is kept also when there are more than one "preceding states" for example step 52 108 that has an assigned state code E0 has two preceding states: 51, 105 and 61, 106 with state codes 0xF0 and 0xE8 respectively. Moving from 0xF0 to 0xE0 involves a single bit (bit[4]) from one to zero. Moving from 0xE8 to 0xE0 involves a single bit (bit[3]) from one to zero. The assignment of state code could be described also as declining/descending gray code, wherein a gray code is code that fulfills the condition that two successive values differ in only one bit. Due to the special conditions of flash memory where writing can only clear a pre-set bit there is an additional condition that requires that any value will differ from its predecessor by exactly one bit that was cleared.

The reason for this condition is that, as mentioned before, flash write operation can only turn "1" into "0" (In order to write "1" were a "0" was previously written the entire block must be erased and re-written). If the state code flag is located in the flash, these conditions on the states codes guarantees that when a write operation failed (due to power loss) there are only two possibilities of a state code that can be read after power-up, either the preceding state code or the current state code. Since the state code is changed only by writing "0"s—there is no data-erase operation required and this guarantees that no other data can be corrupted during state code modification, other than the single bit that is been modified.

Figure 2:
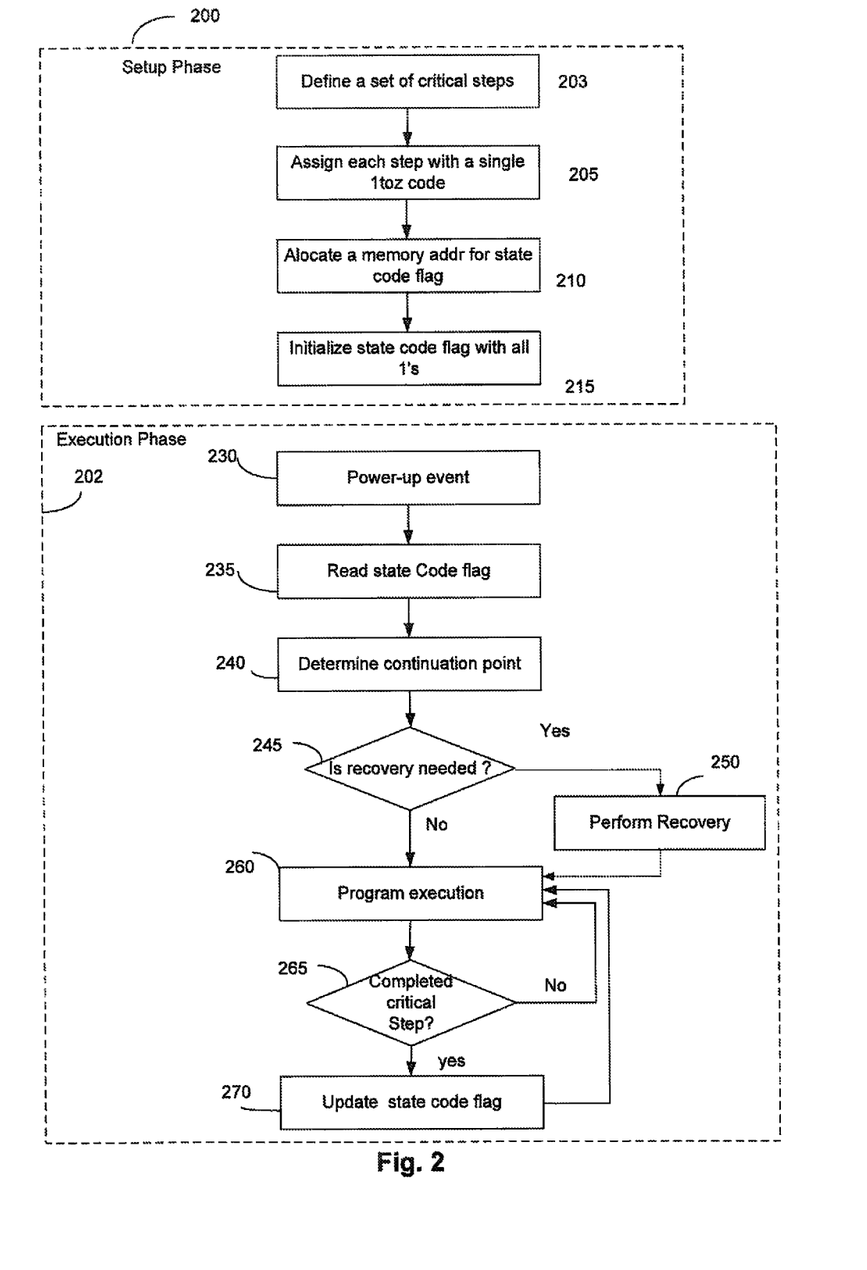
FIG. 2 is a schematic flow chart describing the steps of controlling flash operation in accordance with the disclosed subject matter.

FIG. 2 is a schematic flow chart describing the steps of controlling flash operation in accordance with the disclosed subject matter. The flow is divided to two phases: a first phase, setup phase 200 and a second phase, execution phase 202.

In the setup phase 200, the set of program/control steps is defined. This definition depends on the nature of the task that is desired. The goal of the present disclosure is to enable recovery from a power loss; therefore it is only required that critical steps of the program (also referred to as critical flash memory operations) will be controlled. Thus it is not required to track all the steps of a certain program. Critical flash memory operations are flash memory operation that if ended in an unknown or unexpected or undefined state may put the flash memory in an undefined state or disable a proper functionality of the flash memory. For example if writing information about data structure in flash, file allocation table or pointers to data is interrupted by an unexpected power down that corrupts the data, then the flash memory functionality may be damaged as non valid values, or values that do not comply with the system properties may stuck the system. Each program/routine should be reviewed and only the critical steps (critical flash memory operations) should be defined (203) (Obviously, the disclosed method will function if non critical flash memory operations will be treated as critical flash memory operations, but in this case the system efficiency will be reduced). Each step should be assigned a state code (205), wherein the state code has to fulfill the conditions as were described above, that a current state differs from its previous state by exactly one bit, and the changing bit should always be "0" in the current state (and "1" in the previous state.). The code that fulfills these requirement will be referenced here as 1toz code.

The system then has to allocate a memory address for a state code flag (210), this address location is the address where the system will update the status of the program (state code flag) upon completion of any of the steps as were defined in step (203) and where the system will check the updated status after occurrence of a power loss. Finally the setup phase includes the step of initializing the code state flag to "1"s (215), which actually means erasure of this location, as previously mentioned—the flash data-erase operation sets the data to all "1"s.

It should be noted that while FIG. 2 shows a certain sequence of steps, the actual order of the steps may change. For example steps (210) and (215) may be performed before steps (203),(205).

In the execution phase 202 a program/routine is executed (260). Whenever a critical step (e.g. "write client I.D.") is completed (265) the system updates the state code flag (270) and returns to program execution. Asynchronously, at each occurrence of power-up (assuming that a power-up indicates that a power loss has previously occurred) (230) the programs jumps to read the state code flag (235) which enables to determine the continuation point (240) from which code execution should the program be continued. There is an option to perform recovery operation (250) in order to return system to the previous state (before the operation that was interrupted by power down). A recovery may be required if for example a power down occurred during a write operation, in this case it is not possible to determine which part of the data was successfully written and the system can validate the old data and start the process of write data from the beginning. An example of recovery will be described with reference to FIG. 5.

Figure 5:
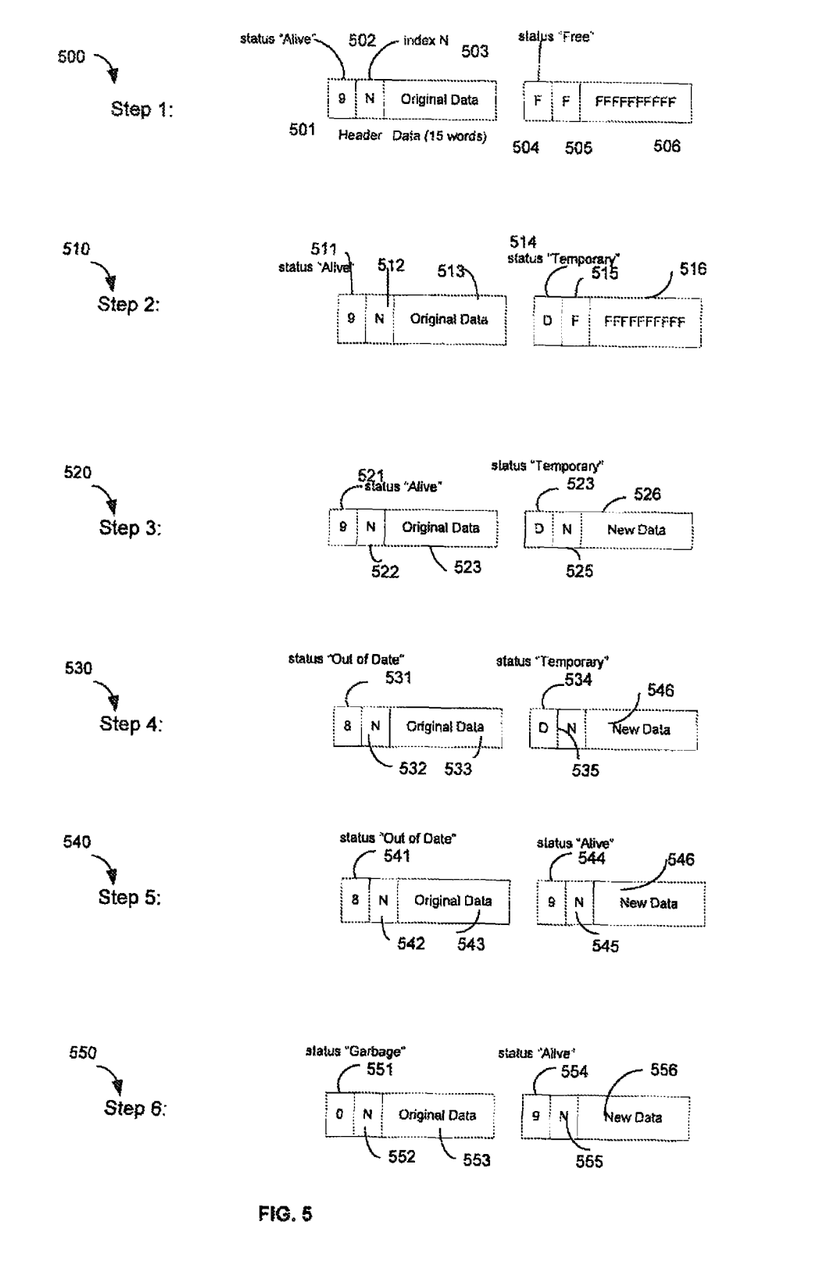
FIG. 5 is a schematic view of storage of general data in flash in accordance the disclosed subject matter.

While the example that is shown in FIG. 1 and the example that is shown in FIG. 5 are specific cases, it could be readily understood by a person skilled in the art that for each state diagram, no matter how complicated it will be, it is possible to assign a set of state codes that will fulfill the state code conditions. Obviously, as the set of flash memory operations becomes more complicated, the size of the state code flag (and the assigned state codes, respectively) must grow. In the case that from one state it is possible to advance to a multiplicity of states, there is a well known technique (useful for applying gray code) to split a single state of an FSM (Final State Machine) into two or more states (addition of states).

Figure 3A:
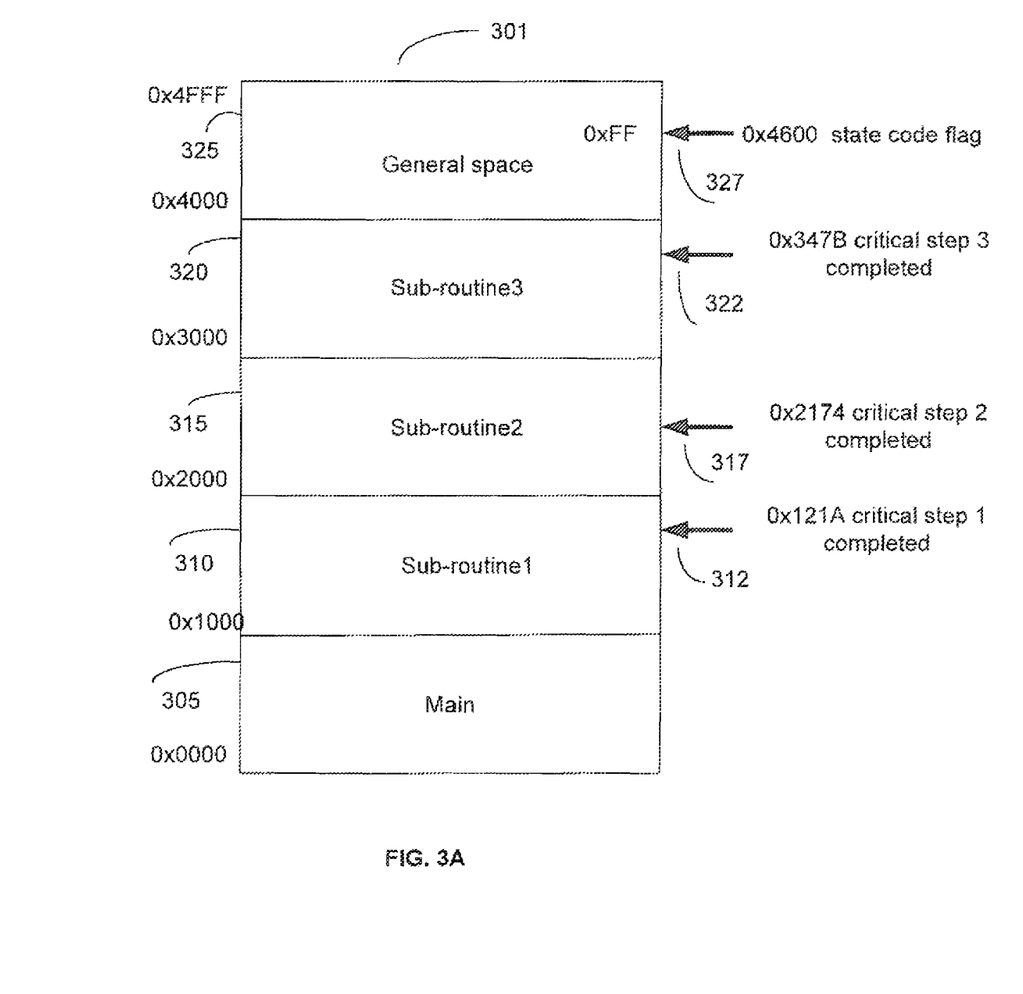
FIG. 3A is a schematic view of a flash memory mapping in accordance with the disclosed subject matter.

FIG. 3A shows a schematic view of the flash mapping in accordance with the disclosed subject matter. The flash memory 301 is divided to five sections: section one at addresses from 0x0000 to 0x0FFF is allocated for the main program 305, section two at addresses from 0x1000 to 0x1FFF is allocated for subroutine 1 310, section two at addresses from 0x2000 to 0x2FFF is allocated for subroutine 2 315, section three at addresses from 0x3000 to 0x3FFF is allocated for subroutine 3 320, section four at addresses from 0x4000 to 0x4FFF is not used and is marked as general space 325. The main program 305 controls the programs and activates the subroutines 310,315 and 320. When a subroutine completes a critical step (critical flash memory operation) by arriving to any of the addresses 0x121A, 0x2174, or 0x347B (marked by numeral 312,317 and 322 respectively)—the program updates state code flag 327 that is located in address 0x4600.

Upon detecting a power-up (and identifying that a power loss occurred) the main program reads state code flag 327 and determines the last critical step that was properly executed.

Figure 3B:
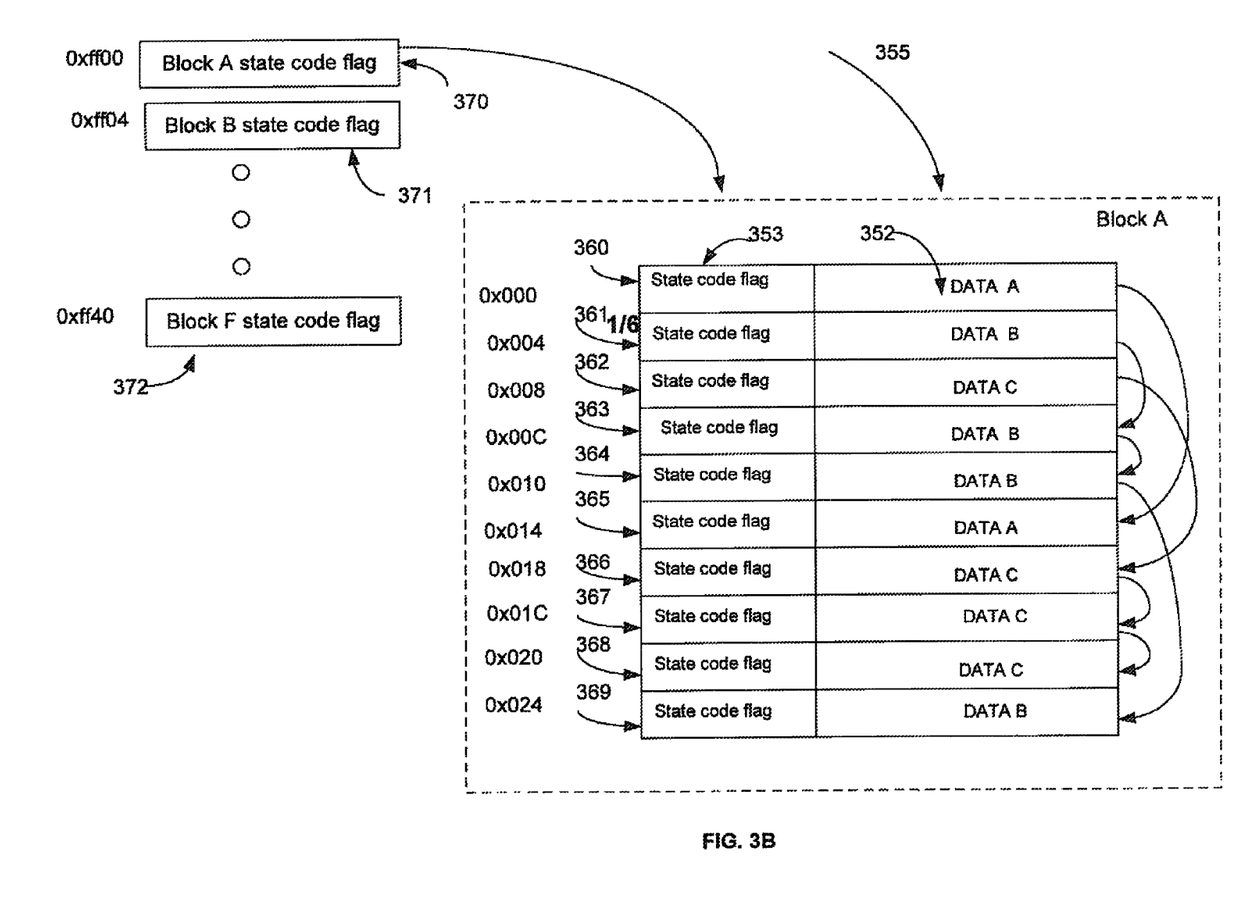
FIG. 3B is a schematic view of data structs in a flash memory in accordance with the disclosed subject matter.
Figure 4:
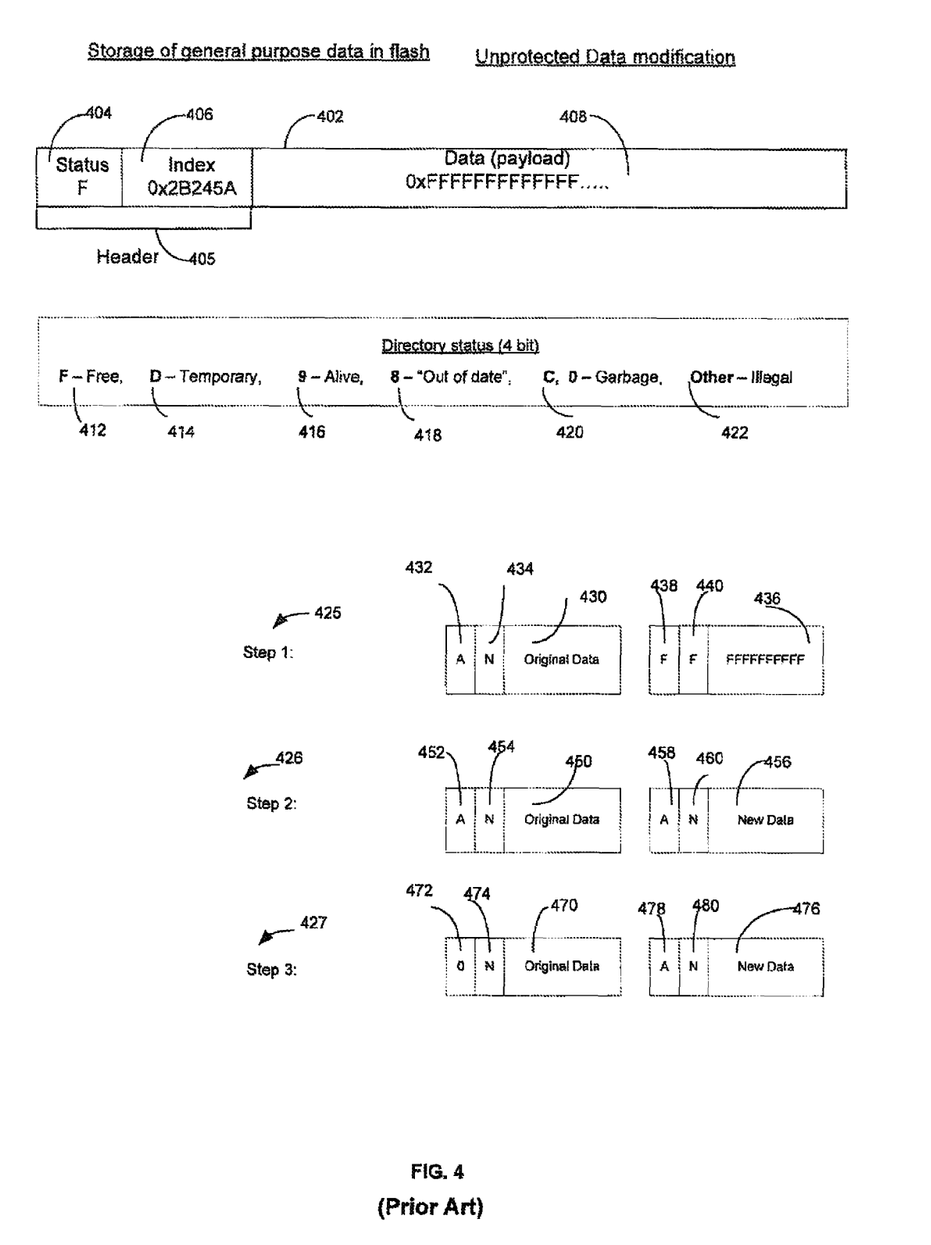
FIG. 4 is a schematic view of storage of general data in flash in accordance with the prior art.

While FIG. 3A shows one possible implementation of the method, there may be various possibilities in which the disclosed method may be implemented. For example executed code (Main, Sub-outline 1,2,3) can be located in any other memory (ROM, RAM, Hard-Disk etc.) with its own addressing. There are 2 cases of relative location of state code flag and protected data: (a) state code flag is attached to the data (as in the example that is shown in FIG.4, 5). In this case state code flag and data are re-initialized to "FFFF" together by the same "erase" operation or (b) state code flag is located in different area of flash (for example, file status is written in File Allocation Table (FAT) but the file itself can be in any other location). In this case re-initialization is separate: erase of file data and erase (garbage collection) of file status from FAT FIG. 3B shows a schematic view of data structs in a flash memory in accordance with the disclosed subject matter. This case describes the first case (a) as mentioned above. In this case a data struct 360-369 contains two fields: data (payload) 352 and a state code flag 353. When there is a need to change the data field, the data is not written in the same address but a new data struct is written in a new location (pointer to the data struct is changed). For example FIG. 3B shows three data structs for data fields A 360, B 361 and C 362. Data B from original address 0x004 is re-written in address 0x00C 363 and later in address 0x010 364 and then at address 0x24 369. Data A originally located at address 0x000 360 is re-written to address 0x014 365, Data C originally located at address 0x008 362 is re-written to address 0x018 366 and then to address 0x01C 367 and then to address 0x020 368. This method of re-writing data to a new location is derived from the flash constraints that writing a "1" where a "0" was previously written requires an erase action (which as previously explained, is relatively very long operation, thus—efficient memory management dictates to avoid erase operations as long as it is possible and when required, to erase an entire block). The described method enables to use free (all "1"s) memory for multiple writes and only when a complete block is used an erase action is performed.

It should be noted that the flag protection mechanism can be hierarchically managed. FIG. 3B describes one block (block A 355) at a certain point in time, the block is fully written and block erase operation should be carried out for the entire block, for example erasure of the block, validating the block clearance etc. therefore the block has its own state code flag 370 which keeps tracking the block status at the level of block memory operations. Each block has its own state code flag, i.e. block B has state code flag at address 0xff04, 371 and block F has its state code flag at address 0xff40, 372.

FIG. 4 shows schematic view of storage of general data in flash in accordance with the prior art. The figure refers to a process where data is stored in 16-words directories. Each directory has one word header 405 that contains directory status 404, directory index 406 and fifteen words of data (payload) 408. The status can be "Free" (all bits are set as an erased flash memory) assigned a value of 0xF, 412; "Temporary" assigned a value of 0xD 414; "Alive" assigned a value of 0x9, 416; "out Of Date" assigned a value of 0x8 418; "Garbage" assigned a value of 0xC (or 0x0) 420. Other values of status are not legal.

In accordance with the prior art the procedure of data modification comprises: Updated data is stored in new directory with the same index as original one. Original directory is marked as "garbage".

Requirements of power down protection:
(a) If power failure occurred during data modification the data should be fully updated according to data modification request or remains unchanged. Partial modification of data is illegal.
(b) Existence of two or more "Alive" directories with the same index is illegal.

The steps of performing storage of general purpose data in according with the prior art comprises:
(a) Step 1 (425): Find original directory with index N, 434 and status "Alive" 432. Find free space for new directory with free status index and data 438,440 and 436 respectively.
(b) Step 2, (426): Create directory with new data 456, index N 460 and status "Alive" 458.
(c) Step 3, (427): Mark original directory as "Garbage".

The prior art suffers some potential problems
(a) if power failure occurred during execution of Step 2 (writing of new directory) the new directory can be created with wrong Data, Status or Index field.
(b) If power failure occurred between Steps 2 and 3 there are two "Alive" directories with the same index (illegal).
(c) If power failure occurred during execution of Step 3 the status of original directory "A" can be changed to wrong value "2" or "8" (one bit is changed, the second remains unchanged)

FIG. 5 shows a schematic view of storage of general data in flash in accordance the disclosed subject matter. FIG. 5 shows the managing of protected data. It is first needed to define critical flash memory operations and non-critical flash memory operations:

Critical flash memory operation: Change directory STATUS.
Non-critical flash memory operation: write new data and index. It is not critical because validity of NEW DATA and INDEX should be confirmed by appropriated STATUS.

It should be noted that critical flash memory operation is executed by modification of single bit from "1" to "0". Power failure can't cause appearance of wrong value.

Step 1, (500): Find original directory with index N and status "Alive" (0x9) (500). Find free space for new directory. (Same as prior art).
Step 2 (critical): (510) Create directory with Temporary status (0xD) 514. Index 515 and data 516 not changed yet.
Step 3: (520) Write new data 526 and Index 525 to new directory
Step 4 (critical): (530) Change status of original directory to "Out of Date" (0x8) 531.
Step 5 (critical): (540) Change status of new "Temporary" (0xD) directory to "Alive" (0x9) 544.
Step 6 (critical): (550) Change status of "Out of Date" directory to "Garbage" 0x0 551. If these steps are performed, it enables the followings:
(a) If power failure occurred between steps 2, (510) and step 4 (530) there is one directory with "Temporary" status. Index and Data in this directory can be corrupted (don't care). There is no "Out of Date" directory yet.
In accordance with the disclosed subject matter, Power Up Recovery procedure requires to change status of "Temporary" directory to "Garbage" ("0xD"→"0xC")
Result: Original data remains unchanged
(b) If power failure occurred between Steps 4 (530) and step 5 (540) there is one directory with "Out of Date" status and one directory with "Temporary" status. Index and Data in Temporary directory are correct because "Out of Date" was marked after completion of step 3 (520).
Power Up Recovery procedure: Continue normal operation from step 5
Result: Data modification will be accomplished
(c) If power failure occurred between Steps 5 and step 6 (550) there is one directory with "Out of Date" status but there is no "Temporary" directory.
Power up Recovery procedure: Continue normal operation from step 6 (550)
Result: Data modification will, be accomplished.

The flow that is shown in FIG. 5 describes that at each point in time, when power fails and later returns, reading the state code flags enables to determine the last critical flash memory operation that was successfully completed, furthermore, data records resulted by critical flash memory operations are saved until it can be determined if a sequential critical flash memory operation was successfully completed. The saved data records resulted by critical flash memory operation that was successfully completed are used for recovering from a following critical flash memory operation that was not successfully completed. As shown before, if power failure occurred between Steps 2 (510) and step 4 (530) the data records with the code flag status "Alive" are used for recovering from a following critical flash memory operation that was not successfully completed. If power failure occurred between Steps 4 (530) and step 5 (540) the data records with the "Temporary" code state status are used for recovering from a following critical flash memory operation that was not successfully completed.

In terms of apparatus perspective, the apparatus comprises a control program for providing an instruction for assigning a state code to the flash memory operations; updating a state code flag with the assigned state code upon completion of each of said flash memory operations; wherein the assignment of said state codes is selected or predefined by the control program such that each of said updating a state code flag is performed by providing an instruction for changing of one bit of the state code flag from one to zero.

It should be appreciated that the above described methods and systems may be varied in many ways, including omitting or adding steps, changing the order of steps and the type of devices used. It should be appreciated that different features may be combined in different ways. In particular, not all the features shown above in a particular embodiment are necessary in every embodiment of the disclosed subject matter. Further combinations of the above features are also considered to be within the scope of some embodiments of the disclosed subject matter.

Section headings are provided for assistance in navigation and should not be considered as necessarily limiting the contents of the section.

It will be appreciated by persons skilled in the art that the present disclosure is not limited to what has been particularly shown and described hereinabove. Rather the scope of the present disclosure is defined only by the claims, which follow.

I claim:

1. A method for managing flash memory operations in a flash memory, the method comprising: assigning a state code to said flash memory operations; updating a state code flag with the assigned state code upon completion of each of said flash memory operations; wherein the assignment of said state codes is selected in a way that each of said updating a state code flag is performed by changing of one bit of the state code flag from one to zero; reading the state code flag upon power up and determining the last critical flash memory operation that was successfully completed; and, wherein data records resulted by a critical flash memory operation that was successfully completed are saved until it can be determined if a sequential critical flash memory operation was successfully completed.

2. The method according to claim 1, wherein the state code flag is located in said flash memory.

3. The method according to claim 1, wherein the saved data records resulted by critical flash memory operation that was successfully completed are used for recovering from a sequential critical flash memory operation that was not successfully completed.

4. An apparatus for managing flash memory operations in a flash memory, the apparatus comprising a control program for: providing an instruction for assigning a state code to said flash memory operations; updating a state code flag with the assigned state code upon completion of each of said flash memory operations; wherein the assignment of said state codes is selected such that each of said updating a state code flag is performed by providing an instruction for changing of one bit of the state code flag from one to zero; providing an instruction by the control program for reading the state code flag upon power up and determining the last critical flash memory operation that was successfully completed; wherein the control program further provides instructions for saving data records resulted by a critical flash memory operation that was successfully completed until it can be determined if a sequential critical flash memory operation was successfully completed.

5. An apparatus according to claim 4, wherein the state code flag is located in said flash memory.

6. An apparatus according to claim 4, wherein the control program uses saved data records resulted by critical flash memory operation that was successfully completed for recovering from a sequential critical flash memory operation that was not successfully completed.

* * * * *